(12) United States Patent
Sitterley

(10) Patent No.: US 6,275,966 B1
(45) Date of Patent: Aug. 14, 2001

(54) ERROR DETECTION FOR RADIO TRANSMISSION INCLUDING LOGICALLY COMBINED PSEUDO-RANDOM NUMBERS AND RELATED TRANSMITTERS, RECEIVERS, AND METHODS

(75) Inventor: Robert A. Sitterley, Forest, VA (US)

(73) Assignee: Ericsson, Inc., Research Triangle Park, NC (US)

( * ) Notice: Subject to any disclaimer, the term of this patent is extended or adjusted under 35 U.S.C. 154(b) by 0 days.

(21) Appl. No.: 09/089,866

(22) Filed: Jun. 3, 1998

(51) Int. Cl.$^7$ .................................................. H03M 13/00
(52) U.S. Cl. ............................................ 714/782; 375/295
(58) Field of Search ................................. 714/752, 782, 714/775; 375/262, 295, 346, 239, 219, 238, 302, 503, 506, 316, 371

(56) References Cited

U.S. PATENT DOCUMENTS

| | | | |
|---|---|---|---|
| 4,716,567 | * 12/1987 | Ito et al. ................................ | 714/752 |
| 5,084,891 | * 1/1992 | Ariyavisitakul et al. ............ | 714/775 |
| 5,113,401 | * 5/1992 | Chevillat et al. .................... | 714/792 |
| 5,206,863 | * 4/1993 | Nazarenko et al. ................. | 714/752 |
| 5,216,677 | * 6/1993 | Takagi et al. ........................ | 714/765 |
| 5,220,568 | * 6/1993 | Howe et al. ......................... | 714/782 |
| 5,243,629 | * 9/1993 | Wei ...................................... | 375/100 |
| 5,353,352 | * 10/1994 | Dent et al. ............................ | 380/37 |
| 5,367,544 | * 11/1994 | Bruekheimer ........................ | 375/368 |
| 5,422,929 | * 6/1995 | Hurst et al. .......................... | 379/4 |
| 5,742,678 | * 4/1998 | Dent et al. ............................ | 380/270 |
| 5,771,288 | * 6/1998 | Dent et al. ............................ | 380/270 |
| 5,875,202 | * 2/1999 | Venters et al. ....................... | 714/752 |
| 6,000,053 | * 12/1999 | Levine et al. ........................ | 714/766 |
| 6,006,353 | * 12/1999 | Inoue ................................... | 714/752 |
| 6,038,380 | * 3/2000 | Wise et al. ........................... | 395/376 |
| 6,081,570 | * 6/2000 | Ghuman et al. ..................... | 375/368 |
| 6,198,783 | * 3/2001 | Campana ............................. | 375/346 |

OTHER PUBLICATIONS

Chang L.F. et al. (Performance of a TDMA portable radio system using a cyclic block code for burst synchronization and error detection; IEEE, Jan. 1993).*

Jolfaei, Effective Block Recovery Schemes for ARQ Retransmission Strategies, IEEE, 1994.*

Lin, et al., Studio–Quality VideoMultiplexer for Satellite Transmission, IEEE, 1990.*

Kozintsev, et al., Image Transmission Using Arithmetic Coding Based Continuous Error Detection, IEEE, 1998.*

* cited by examiner

Primary Examiner—Albert Decady
Assistant Examiner—Guy Lamarre
(74) Attorney, Agent, or Firm—Myers Bigel Sibley & Sajovec

(57) ABSTRACT

A digital radio communication is transmitted by generating a digital message to be transmitted and generating an error detection code corresponding to the digital message. The error detection code is logically combined with a predetermined number thereby generating a transmission code, and the digital message and the transmission error code are transmitted over a radio channel. More particularly, the predetermined number and the error detection code can be logically combined using the exclusive-OR function.

40 Claims, 6 Drawing Sheets

FIG. 5

| LID/GID Pattern | # Bit Slips | Add/ Delete Bit(s) | Begin Bit Position | Bit Inserted | #Msgs Bad (Fail BCH) (Out of 27) | # Msgs Error Free | # Msgs Corrected at Bit 0 | # Msgs Corrected at Bit 32 | # Msgs Corrected at Bit 33 | # Msgs Corrected at Bit 44 |
|---|---|---|---|---|---|---|---|---|---|---|
| 101010- | 0 | - | - | - |  | 27 |  |  |  |  |
|  | 1 | Delete | 0 | - | 19 |  |  |  |  | 8 |
|  | 1 | Delete | 23 | - | 19 |  |  |  |  | 8 |
|  | 1 | Add | 0 | 0 | 15 |  | 12 |  |  |  |
|  | 1 | Add | 0 | 1 | 15 |  | 12 |  |  |  |
|  | 1 | Add | 23 | 0 | 15 |  | 12 |  |  |  |
|  | 1 | Add | 23 | 1 | 15 |  | 12 |  |  |  |
|  | 2 | Delete | - | - | 27 |  |  |  |  |  |
|  | 2 | Add | - | - | 27 |  |  |  |  |  |
| 010101- | 0 | - | - | - |  | 27 |  |  |  |  |
|  | 1 | Delete | 0 | - | 19 |  |  |  |  | 8 |
|  | 1 | Delete | 23 | - | 19 |  |  |  |  | 8 |
|  | 1 | Add | 0 | 0 | 16 |  | 11 |  |  |  |
|  | 1 | Add | 0 | 1 | 16 |  | 11 |  |  |  |
|  | 1 | Add | 23 | 0 | 16 |  | 11 |  |  |  |
|  | 1 | Add | 23 | 1 | 16 |  |  |  |  |  |
|  | 2 | Delete | - | - | 27 |  |  |  |  |  |
|  | 2 | Add | - | - | 27 |  |  |  |  |  |

FIG. 6

| BCH | SNR (dB) | Fade Model | Speed (KPH) | # Bits Slips | Add/ Delete | Bit Added | # False Msgs | # False Emergencies |
|---|---|---|---|---|---|---|---|---|
| Normal | 12 | Typical Urban | 50 | 0 | - | - | 1 | 0 |
| | 12 | Bad Urban | 50 | 0 | - | - | 2 | 0 |
| | 12 | Simulcast | 100 | 0 | - | - | 4 | 1 |
| | 18 | Simulcast | 50 | 0 | - | - | 2 | 0 |
| | 12 | Simulcast | 100 | 0 | - | - | 4 | 1 |
| | 18 | Simulcast | 50 | 0 | - | - | | |
| Normal | 18 | Simulcast | 50 | 1 | Delete | - | 1083 | ~130 |
| | 18 | Simulcast | 50 | 1 | Add | 0 | 1630 | ~180 |
| | 18 | Simulcast | 50 | 1 | Add | 1 | 1597 | ~180 |
| Pseudo | 18 | Simulcast | 50 | 0 | - | - | | |
| Pseudo | 18 | Simulcast | 50 | 1 | Delete | - | 3 | 0 |
| | 18 | Simulcast | 50 | 1 | Add | 0 | 6 | 0 |
| | 18 | Simulcast | 50 | 1 | Add | 1 | 7 | 0 |

FIG. 7

| MTA | Code | Inbound Message Type |
|---|---|---|
| 0 | 0000 | Clear Voice Group Call |
| 1 | 0001 | Undefined |
| 2 | 0010 | Digital Voice Group Call |
| 3 | 0011 | Emergency Digital Voice Group Call |
| 4 | 0100 | Voice Login |
| 5 | 0101 | TDMA Group Call |
| 6 | 0110 | TDMA Emergency Group Call |
| 7 | 0111 | Data Login |
| 8 | 1000 | Undefined |
| 9 | 1001 | Undefined |
| 10 | 1010 | TDMA Host Data Call Request |
| 11 | 1011 | Undefined |
| 12 | 1100 | Emergency Clear Voice Group Call |
| 13 | 1101 | Undefined |
| 14 | 1110 | Cancel Emergency |
| 15 | 1111 | Other Call Types |

ERROR DETECTION FOR RADIO TRANSMISSION INCLUDING LOGICALLY COMBINED PSEUDO-RANDOM NUMBERS AND RELATED TRANSMITTERS, RECEIVERS, AND METHODS

FIELD OF THE INVENTION

The present invention relates to the field of radio communications and more particularly to error detection and correction for radio transmission.

BACKGROUND OF THE INVENTION

Trunked radio communications systems are commonly used to provide radio communications between a plurality of mobile terminals and one or more base stations using a plurality of control and traffic channels. In general, a radio communication is set up between a mobile terminal and the base station, or between two mobile stations using a control channel. For example, a mobile terminal can send a communications request over a control channel requesting the use of a traffic channel. Depending on the current system usage, an available traffic channel can be allocated to the mobile terminal by sending a return control message to the mobile terminal over the control channel identifying the allocated traffic channel.

A conventional trunked radio communications system is illustrated in FIG. 1. As shown, the base station includes a controller 25 and a plurality of base station antennas 23 wherein each base station antenna 23 services a different geographic area 36. Moreover, the communications system can be a simulcast system wherein the same radio signals 32 are transmitted simultaneously from each of the base station antennas. Accordingly, once a traffic channel is assigned to a mobile terminal, the mobile terminal can communicate using the traffic channel as it moves between geographic areas 36 without requiring handoffs from one base station antenna to the next.

Simulcast systems are commonly used, for example, by fire departments, police departments, or other government organizations as well as by private organizations requiring a dedicated communications system. In such a system, a mobile terminal 21 transmits a control message over a control channel when radio communications are desired. This control message may be a digital message including an identification number for the requesting mobile terminal, as well as a priority status indicator which indicates a relative priority of the communications request. For example, the priority status indicator can indicate one of a low priority status such as a non-emergency status, or a high priority status such as an emergency status.

This priority status can then be used by the communications system to prioritize the assignment of communications channels. For example, a communication channel can be allocated responsive to a high priority request before a communications channel is allocated responsive to another low priority request, or a low priority communication can be interrupted to provide a communication channel responsive to a high priority request.

Transmission errors such as bit slips, however, may occur reducing the reliability of the communications system. For example, multiple transmission paths between a mobile terminal and the base station may result in multi-path interference. In other words, a control message transmitted by a mobile terminal may be received by two base station antennas at slightly different times, or the control message may be received twice at the same base station as a result of reflections off terrain or man made structures. Errors may also occur as a result of non-system interference, noise, or fading. In addition, transmission errors may occur with respect to messages transmitted over traffic channels.

To reduce transmission errors, error correction and detection codes, such as Bose-Chaudhuri-Hocquenghem (BCH) codes, have been added to digital control messages. Accordingly, the control messages discussed above may have error detection and correction (EDC) codes appended thereto. In particular, an error detection and correction code can be generated for each digital control message to be transmitted, and this error detection and correction code can be transmitted with the control message. The control message and the error detection and correction code are then received at the base station where an error detection and correction algorithm can be used to detect and correct errors in the received control message using the error detection and correction code. Error detection and correction codes can also be used with digital messages transmitted over traffic channels, as well as messages transmitted from the base station to the mobile terminal.

Bit slips, however, may occur during transmission due to interference as discussed above. A bit slip may result in a received control message with an error which is not detected using conventional error detection and correction codes, or a bit slip may result in a detected error which is incorrectly corrected. In either case, an incorrect control message may be received and processed as if it were correct. Simulations have shown that up to 30% of digital control messages transmitted with bit slips using conventional BCH error detection and correction may be incorrectly received and processed. In particular, it has been found that low priority communications request messages may be incorrectly received and processed as high priority communications request messages as a result of bit slips even though BCH error detection and correction codes are used. Accordingly, low priority communications may be given priority treatment unnecessarily interrupting or delaying other communications. Bit slips may also occur on control messages transmitted back to the mobile terminal thereby delaying communications. In addition, bit slips may occur on digital messages transmitted over traffic channels reducing the reliability of communications.

Similar problems may also occur in cellular communications systems wherein adjacent base station antennas use different communications channels thereby allowing a reuse of communications channels across the system. Because adjacent base stations use different communications channels, it may be necessary to provide hand-offs from a communication channel of a first base station antenna to a communication channel of a second base station when a mobile terminal moves from the area covered by the first base station antenna to an area covered by the second base station antenna. While a cellular communications system may reduce interference between adjacent base station antennas, bit slips may still occur as a result of multi-path effects due to terrain, buildings, and other structures. For example, a signal transmitted by a mobile terminal may follow a first direct path to the servicing base station antenna as well as a second reflected path due to a reflection off a building, and the two signal paths may interfere thereby resulting in bit slips.

Accordingly, there continues to exist a need in the art for improved methods and systems for transmitting and receiving radio communications signals.

SUMMARY OF THE INVENTION

It is therefor an object of the present invention to provide improved radio communications methods and systems.

It is another object of the present invention to provide methods and systems for transmitting error detection codes with increased reliability.

These and other objects are provided according to the present invention by transmitting a digital message using an error detection and correction (EDC) code to improve the reliability of communications wherein the error detection and correction (EDC) code is logically combined with a predetermined number to generate a transmission code. This transmission code is appended to the digital control message before transmission. At the receiver, the transmission code can be extracted from the digital message and logically combined with the predetermined number before performing error detection and correction on the digital control message.

By logically combining the EDC code and the predetermined number both before transmission and after reception, the probability of accepting a digital message with a bit slip as being correctly received can be reduced. Moreover, the probability of making an incorrect correction of a digital message with a bit slip can also be reduced. The Applicant theorizes that the logical combination of the EDC code and the predetermined number can break up a cyclic nature of the EDC code, and in particular, the cyclic nature of a BCH EDC code, thereby reducing the probability that a message with a bit slip is accepted as a correct message.

A method according to the present invention can include the steps of generating a digital message to be transmitted and generating an error detection code corresponding to the digital message. The error detection code is logically combined with a predetermined number to generate a transmission code, and the digital message and the transmission code are transmitted over a radio channel. More particularly, the error code and the predetermined number can be logically combined using the exclusive-OR function.

The digital message and the transmission can then be received over the radio channel, and the transmission code can be logically combined with the predetermined number thereby recovering the error detection code. Error detection can then be performed on the received digital message using the recovered error detection signal thereby increasing the reliability of the communications system. In particular, the logical combining step before transmission and the logical combining step after reception can both be performed using the exclusive-OR operation and using the same predetermined number.

Moreover, the error detection code can include a first plurality of bits, the predetermined number can include a second plurality of bits, and the transmission code can include a third plurality of bits, wherein the first, second, and third pluralities of bits each include a common number of bits. The predetermined number can be a pseudo-random number including the binary pattern 1010, and this binary pattern can be chosen from the group including 101010101100, 101011001010, and 110010101010. In addition, the error detection code can be an error detection and correction code such as a Bose-Chaudhuri-Hocquenghem error detection, and correction code so that transmission errors can be corrected.

The present invention can thus provide improved performance for radio communications using error detection and correction codes and algorithms. The likelihood of detecting transmission errors can thus be increased thereby increasing the reliability of communications.

BRIEF DESCRIPTION OF THE DRAWINGS

FIG. 5 is a table of bit slip simulation results for transmissions using conventional BCH codes.

FIG. 6 is a table of bit slip simulation results for transmissions using BCH codes combined with a predetermined number using the exclusive-OR function.

FIG. 7 is a table of Message Type A (MTA) codes corresponding to inbound message types according to the present invention.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

According to the present invention, a digital message can be transmitted using an error detection and correction (EDC) code to improve the reliability of communications. More particularly, the error detection and correction (EDC) code is logically combined with a predetermined number using the exclusive-OR function to generate a transmission code, and the transmission code is appended to the digital control message before transmission. At the base station, the transmission code is extracted from the digital message and logically combined with the predetermined number using the exclusive-OR function before performing error detection and correction on the digital control message.

By performing the exclusive-OR function on the EDC code both before transmission and after reception using the same predetermined number, the probability of accepting a digital message with a bit slip as being correctly received can be reduced. Moreover, the probability of making an incorrect correction of a digital message with a bit slip can also be reduced. The Applicant theorizes that the logical combination of the EDC code and the predetermined number using the exclusive-OR function may break up a cyclic nature EDC code, and in particular, the cyclic nature of a BCH EDC code, thereby reducing the possibility that a message with a bit slip is accepted as a correct message.

The present invention will now be discussed in greater detail with reference to FIGS. 2 and 3 with respect to the transmission of a digital control message from a mobile terminal over a control channel to a base station of a simulcast communications system. It will be understood, however, that the methods and systems of the present invention can be used for the transmission of control messages over control channels from the base station to a mobile terminal, or for the transmission of digital messages over traffic channels to and from the base station. Furthermore, the methods and systems of the present invention can also be applied to other radio communications systems such as cellular communications systems.

Figure 1:
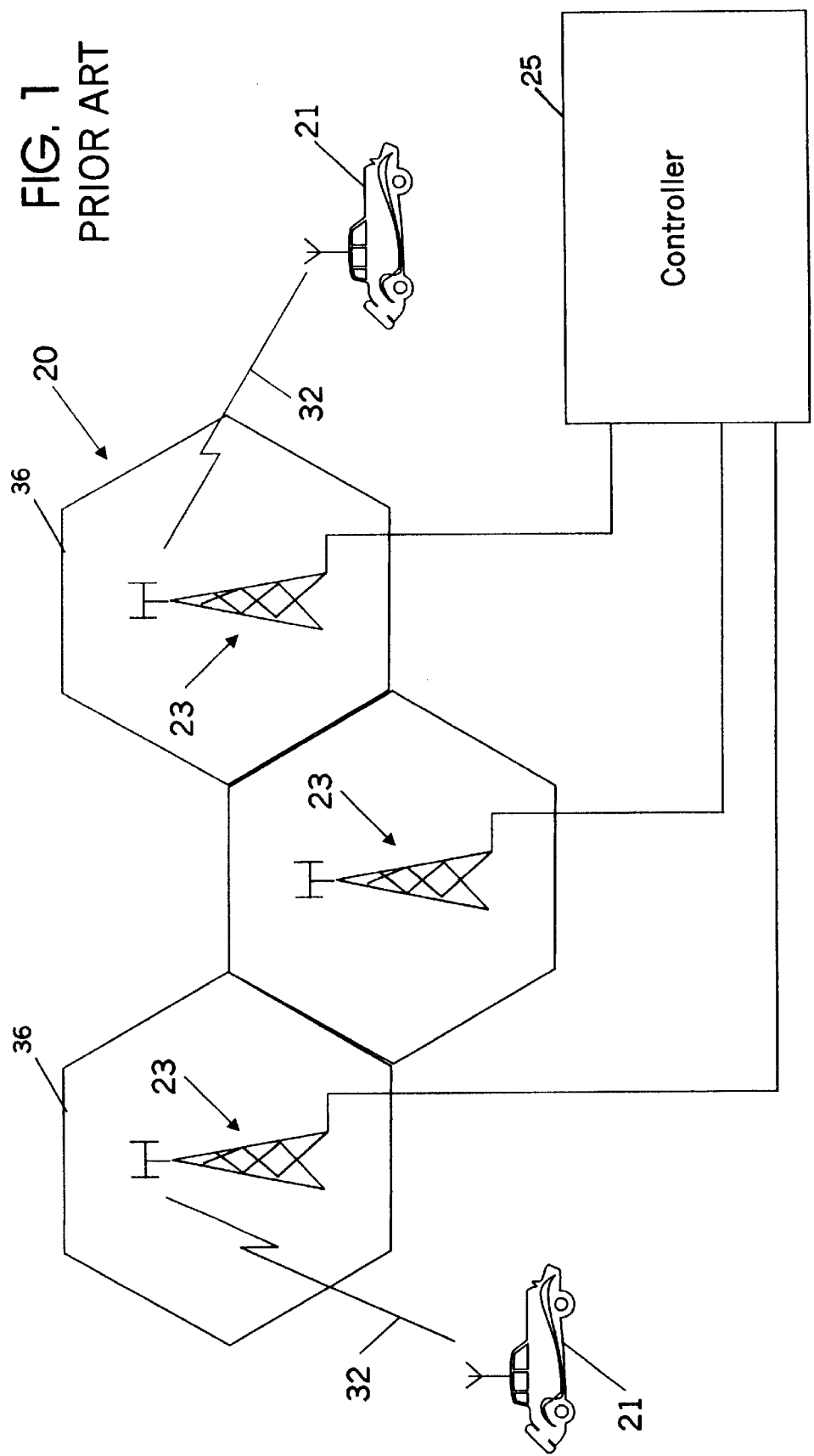
FIG. 1 is a schematic diagram of a trunked communications system according to the prior art
Figure 2:
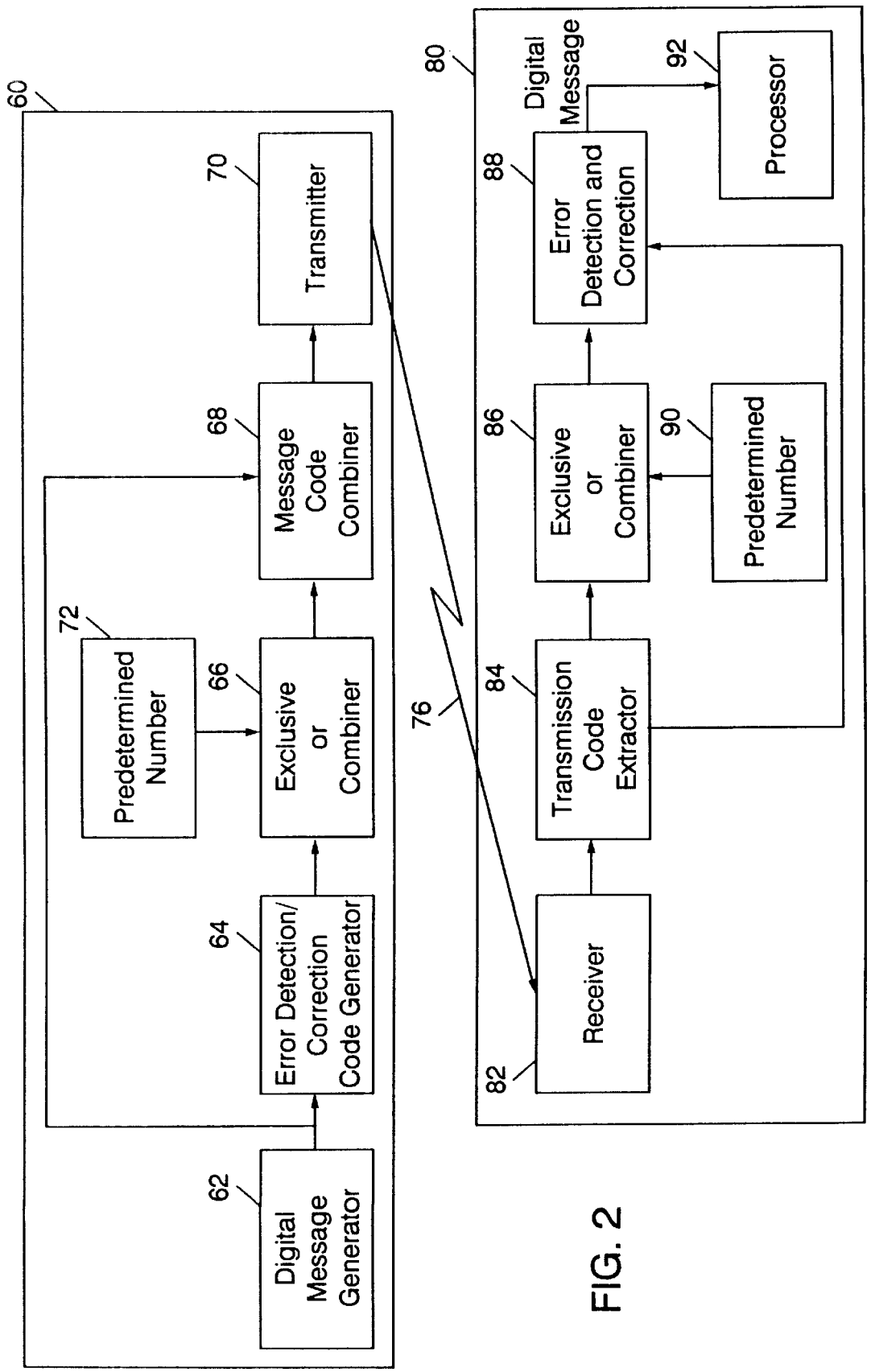
FIG. 2 is a block diagram illustrating a transmitter and a receiver according to the present invention.

As shown in FIG. 2, the mobile terminal 60 includes a digital message generator 62 which generates digital messages to be transmitted. The digital message generator can include the hardware and/or software used to convert analog signals to digital messages and/or to generate digital control messages to be transmitted to the base station 80. For example, analog signals such as analog voice signals can be converted to digital messages, and digital control messages such as a request for a communications channel can be generated.

In particular, the digital message generator can generate a request for communications control message having either a high or a low priority. This request control message is made up of a plurality of bits, and includes a unique identification number for the mobile terminal as well as a priority status indicator which can be one or more bits having a first value to indicate a low priority (non-emergency) request and a second value to indicate a high priority (emergency) request. As previously discussed, the priority status indicator can be used by the base station to expedite a communications channel allocation in response to a high priority request.

The digital message is provided by the digital message generator 62 to the error detection and correction (EDC) code generator 64, and the EDC code generator generates an EDC code responsive to the digital message. As will be understood by those having skill in the art, the EDC code can be used by the base station to detect transmission errors and even to correct certain transmission errors. The EDC code is then logically combined with a predetermined number 72 such as a pseudo-random number using an exclusive-OR operation at the exclusive-OR combiner 66 to provide a transmission code.

As an example, the control message transmission methods and systems of the present invention can be advantageously used in the Enhanced Digital Access Communications System (EDACS) manufactured by Ericsson, Inc. In this system, a digital control message can include 28 bits or even 33 bits (extended address), and the BCH EDC code can include 12 bits. A 12 bit BCH EDC code can be used to provide error detection as well as 1 bit error correction. With a 12 bit BCH EDC code, the predetermined number can include the binary pattern 1010. In this example, the predetermined number can be a 12 bit binary number selected from the group including 101010101100 (hexadecimal AAC), 101011001010 (hexadecimal ACA), and 110010101010 (hexadecimal CAA). Other numbers, however, can also be used.

The transmission code is then appended to the digital message at the message/code combiner 68, and the combined transmission code and digital message are transmitted by the transmitter 70 over a radio channel 76. In particular, a digital control message can be transmitted over a control channel. Alternately, a digital traffic message, such as a digital voice or data message, can be transmitted over a traffic channel.

The combined digital message and transmission code are received at the base station receiver 82, and the transmission code is extracted from the digital message by the transmission code extractor 84. The transmission code is then combined with the predetermined number 90 using the exclusive-OR operation at exclusive-OR combiner 86 to regain the original EDC code (provided no transmission errors have occurred). Error detection and correction algorithms (such as BCH algorithms) are then performed by error detection and correction unit 88 on the digital message from the transmission code extractor 84 using the EDC code from the exclusive-OR combiner 86 to provide the received digital message. The digital message can be further processed by processor 92 to initiate allocation of a communications channel in the case of a request for communications, or to provide a voice or data output in the case of a voice or data message.

Accordingly, a control message requesting allocation of a communications channel can be transmitted by the mobile terminal 60 to the base station 80 with a transmission code obtained by combining a BCH EDC code with a predetermined number using an exclusive-OR operation. The control message and the transmission code can be received by the base station 80 and the BCH EDC code regained by combining the transmission code with the same predetermined number using the exclusive-OR operation. The use of the transmission code has been found to reduce the probability that a control message including a transmission error such as a bit slip will be mistaken by the error detection and correction algorithm as a correctly received message. The probability that a low priority request for communications is mistaken for a high priority request as the result of a bit slip can thus be reduced.

The probability that a low priority request is mistaken for a high priority request can be further reduced by only accepting high priority requests that are the result of messages which pass the error detection and correction algorithm with no indicated errors. In other words, high priority requests which include one or more bits corrected by the error detection and correction algorithm can be disregarded thereby further reducing the number of false high priority messages. Alternatively, the high priority status of a message with one or more bits corrected by the EDC algorithm can be ignored so that the message is processed as a low priority message.

As will be appreciated by those of skill in the art, the above described aspects of the present invention in FIG. 2 may be provided by hardware, software, or a combination of the above. While various components of the apparatus of the present invention such as the error detection and correction features, exclusive-OR combiners, message/code combiner, transmission code extractor, processor, digital message generator, transmitter, and receiver, have been illustrated in part as discrete elements in FIG. 2, they may, in practice, be implemented in whole or in part by microcontrollers in the mobile terminal and base station including input and output ports and running software code, by custom or hybrid chips, by discrete components or by a combination of the above. In particular, the error detection and correction features, the exclusive-OR combiners, the transmission code extractor, and the message/code combiner may be implemented as segments of existing memory and additional code executing on an existing processors of the mobile terminal and base station.

Figure 3:
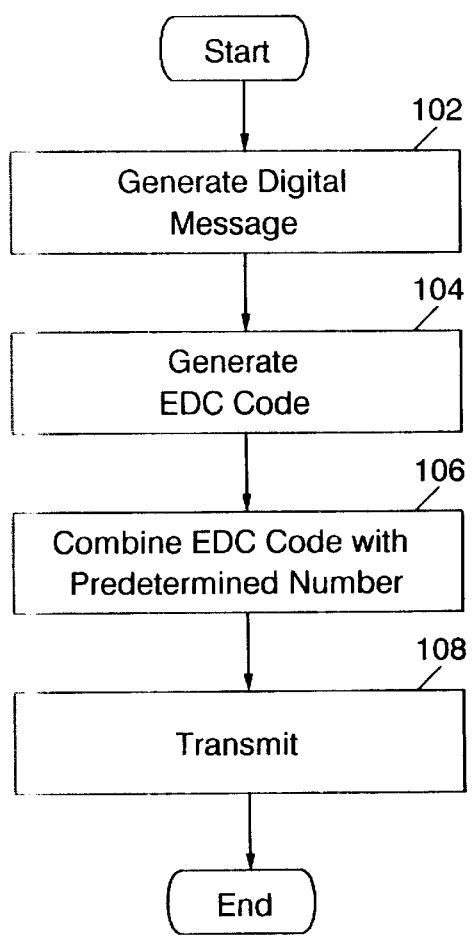
FIGS. 3 and 4 are flow charts illustrating operations for transmitting and receiving digital radio communications, respectively, according to the present invention.

Operations for transmitting digital messages according to the present invention are illustrated in FIG. 3. In particular, a digital message is generated at block 102, and an error detection and correction code is generated at block 104 responsive to the digital message. In particular, the error detection and correction (EDC) code can be a Bose-Chadhuri-Hocquenghem code. The EDC code thus generated is combined with a predetermined number at block 106 using the exclusive-OR function to provide a transmission code. The digital message and the transmission code are then transmitted at block 108.

Figure 4:
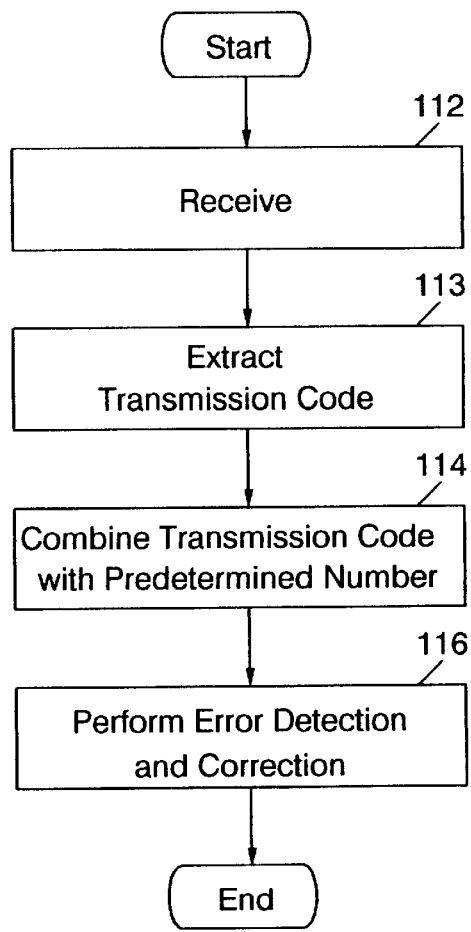

Operations for receiving the digital message and transmission code thus transmitted are illustrated in FIG. 4. The digital message and transmission code are received at block 112, and the transmission code is extracted at block 113. The transmission code is then combined with the predetermined number (discussed above with regard to block 106 of FIG. 3) using the exclusive-OR function to regain the EDC code. Error detection and correction algorithms are then performed on the digital message using the EDC code at block 116.

The present invention has been described above with respect to FIGS. 3 and 4 with reference to flowcharts illustrating operations of the present invention. It will be understood that each block of the flowchart, and combinations of blocks in the flowchart, can be implemented by computer program instructions. These program instructions may be provided to a processor to produce a machine, such that the instructions which execute on the processor create means for implementing the functions specified in the flowchart block or blocks. The computer program instructions may be executed by a processor to cause a series of operational steps to be performed by the processor to produce a computer implemented process such that the instructions which execute on the processor provide steps for implementing the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based systems which perform the specified functions or steps, or combinations of special purpose hardware and computer instructions.

The results of simulations used to quantify the improvements obtained using the methods and systems of the present invention are provided in FIGS. 5 and 6. The simulations were performed using an Signal Processor Work (SPW) system simulation tool sold by the Alta Group of Cadence Design Systems, Incorporated. The simulations were set to model the operation of an EDACS system according to the following parameters: Dotting-Barker generation (defines 93 bits of dotting followed by 48 bits of triplicated Barker); Extended Address (EA) message generation (33 bit message with 27 message types); BCH encoding (12 bits BCH encoding to provide multiple bit error detection and single bit error correction); pseudo-random code application before transmission (exclusive-or of BCH bits with defined data pattern); message triplication (middle copy inverted); over the air channel (defines signal to noise ratio and fading model); Dotting-Barker check (meet m of n criterion for message acceptance); bit slip (applied to received message only and fixed to a specific number of bits slipped and location of slip); voting of triplicated message; pseudo-random code application after reception (exclusive-or of BCH bits with defined data pattern); BCH decode; and error logging (save messages that meet BCH criteria and are different from that sent). In the simulations, bit slips were forced in the message. When enabled, each message was given a run of 8100 trials (27 message types ×300 trials per message), and each message was forced to a specific slip condition (slip or no slip, number of bits slipped, 0 or 1 inserted, bit number in the triplicated message where the slip begins).

A bit slip may occur in a received serial bit stream when a bit is either added to or deleted from the serial bit stream. Multiple bit slips may also occur within the serial bit stream. As will be understood, a serial bit stream may include one or more digital messages.

FIG. 5 includes the results of the simulation of EDACS transmissions including conventional BCH encoding. In this simulation, each message of the message set was generated, triplicated, and then slipped a bit in either direction. Each received message was then checked to see if it still met the BCH criteria. The results provided in FIG. 5 indicate that some messages (approximately 30%) still meet the BCH criteria even though a bit slip occurred. The Logical Identification (LID) and Group Identification (GID) portions of the messages were transmitted using different patterns (1010 . . . and 0101 . . . ) and similar results were obtained. Starting the bit slip half way through the first of the triplicated set (at bit 23) had no significant effect on the results. Bit slips can thus cause incorrect messages to be accepted using conventional BCH EDC encoding and decoding. In some cases, non-emergency messages can be accepted as emergency messages as a result of bit slips. Furthermore, slipping two bits in either direction resulted in failing the BCH EDC check on all message types.

FIG. 6 includes the results of the simulation of EDACS transmissions using BCH EDC encoding and decoding according to the present invention. These simulations show that relatively few false messages are accepted when the BCH code is combined with a predetermined number using the exclusive-OR function both before transmission and after reception according to the present invention. In particular, 8100 trials (27 messages×300 runs each) were run without introducing bit slips. Occasionally, a false emergency request would result.

When bit slips were introduced, false message acceptances increased to approximately 1100 to 1600 false messages accepted out of 8100 messages with a corresponding increase in the number of false emergency requests received. By modifying the simulation to count only those false messages which met the BCH EDC criteria with no bit errors, it was found that 79 of 8100 messages with introduced bit slips met the BCH EDC criteria with no bit errors. Accordingly, the performance of the present invention can be further improved by accepting only those emergency requests that meet the BCH EDC criteria with no bit slips while using the BCH pseudo-random number exclusive-OR combining of the present invention. In other words, the exclusion of emergency requests including bit errors can further reduce the number of false emergency requests by a factor of approximately 14 as opposed to using only BCH pseudo-random number exclusive-OR combining.

The performance of the EDACS system can be further improved by using the Message Type A (MTA) codes of FIG. 7 for inbound messages. As shown, the MTA codes 0011, 0110, and 1100 can be used to identify the emergency inbound message types, and these emergency MTA codes can reduce the probability that a bit slip results in a false emergency message. The possibility of a false emergency message can be still further reduced by not using other codes such as 0001, 1110, and 0111 which can more easily slip to one of the emergency codes. Alternately, MTA codes which can more easily slip to one of the emergency codes can be assigned to relatively low frequency inbound message types.

The methods and systems of the present invention can thus be used to increase the reliability of digital radio communications. Digital messages can be transmitted and received such that the probability of a corrupted message being accepted as a correct message is significantly reduced. In particular, the likelihood that a low priority requested for a communications channel is received as a high priority request can be reduced. The methods and systems of the present invention, however, can also be used to increase the reliability of other control messages sent by mobile terminals and/or the base station, as well as to increase the reliability of voice and data messages transmitted over traffic channels.

In the drawings and specification, there have been disclosed typical preferred embodiments of the invention and, although specific terms are employed, they are used in a generic and descriptive sense only and not for purposes of limitation, the scope of the invention being set forth in the following claims. While the present invention has been discussed above with reference to a terrestrial radio communications system, the methods and systems of the present invention can also be applied in a satellite radio communications system.

What is claimed is:

1. A method of transmitting a digital radio communication, said method comprising the steps of:
   generating a digital message to be transmitted;
   generating an error detection code corresponding to the digital message;
   after said step of generating the error detection code, logically combining the error detection code with a predetermined number thereby generating a transmission code; and
   transmitting the digital message and the transmission code over a radio channel.

2. The method according to claim 1 wherein the logically combining step comprises performing an exclusive-OR operation on the error detection code and the predetermined number.

3. The method according to claim 1 wherein the error detection code comprises a first plurality of bits, wherein the predetermined number comprises a second plurality of bits, and wherein the transmission code comprises a third plurality of bits, and wherein the first, second, and third pluralities of bits each comprise a common number of bits.

4. The method according to claim 3 wherein the predetermined number comprises a pseudo-random number.

5. The method according to claim 4 wherein the pseudo-random number comprises a binary pattern including 1010.

6. The method according to claim 5 wherein the binary pattern is chosen from the group consisting of 101010101100, 101011001010, and 110010101010.

7. The method according to claim 1 wherein the error detection code comprises an error detection and correction code.

8. The method according to claim 7 wherein the error detection and correction code comprises a Bose-Chaudhuri-Hocquenghem error detection and correction code.

9. The method according to claim 1, wherein the predetermined number is not a part of the digital message to be transmitted.

10. A method of receiving a digital radio communication over a radio channel wherein the digital radio communication includes a digital message and a transmission code and wherein the transmission code is generated by logically combining an error detection code with a predetermined number prior to transmission over the radio channel, the method comprising the steps of:
   receiving the digital message and the transmission code over the radio channel;
   logically combining the transmission code with the predetermined number thereby recovering the error detection code; and
   after logically combining the transmission code with the predetermined number, performing error detection on the received digital message using the recovered error detection code.

11. The method according to claim 10 wherein the step of logically combining the transmission code with the predetermined number comprises performing an exclusive-OR operation on the transmission code and the predetermined number.

12. The method according to claim 10 wherein the error detection code comprises a first plurality of bits, wherein the predetermined number comprises a second plurality of bits, and wherein the transmission code comprises a third plurality of bits, and wherein the first, second, and third pluralities of bits each comprise a common number of bits.

13. The method according to claim 12 wherein the predetermined number comprises a pseudo-random number.

14. The method according to claim 13 wherein the pseudo-random number comprises a binary pattern including 1010.

15. The method according to claim 14 wherein the binary pattern is chosen from the group consisting of 101010101100, 10101 1001010, and 110010101010.

16. The method according to claim 10 wherein the error detection code comprises an error detection and correction code.

17. The method according to claim 16 wherein the error detection and correction code comprises a Bose-Chaudhuri-Hocquenghem error detection and correction code.

18. The method according to claim 10:
   wherein the digital message includes a priority status indicator indicating one of a high priority and a low priority for the digital message; and
   wherein the step of performing error detection further comprises disregarding a high priority status of the digital message when an error is detected so that the digital message is processed as a low priority digital message.

19. The method according to claim 10:
   wherein the digital message includes a priority status indicator indicating one of a high priority and a low priority for the digital message; and
   wherein the step of performing error detection further comprises disregarding the digital message when a high priority status is indicated and an error is detected.

20. The transmitter according to claim 10, wherein the predetermined number is not a part of the received digital message.

21. A transmitter for transmitting digital radio communications including a digital message, the transmitter comprising:
   means for generating an error detection code corresponding to the digital message;
   means for logically combining the error detection code with a predetermined number after generating the error detection code thereby generating a transmission code; and
   means for transmitting the digital message and the transmission code over a radio channel.

22. The transmitter according to claim 21 wherein the means for logically combining the error detection code with the predetermined number comprises means for performing an exclusive-OR operation on the error code and the predetermined number.

23. The transmitter according to claim 21 wherein the error detection code comprises a first plurality of bits, wherein the predetermined number comprises a second plurality of bits, and wherein the transmission code comprises a third plurality of bits, and wherein the first, second, and third pluralities of bits each comprise a common number of bits.

24. The transmitter according to claim 23 wherein the predetermined number comprises a pseudo-random number.

25. The transmitter according to claim 24 wherein the pseudo-random number comprises a binary pattern including 1010.

26. The transmitter according to claim 25 wherein the binary pattern is chosen from the group consisting of 101010101100, 101011001010, and 110010101010.

27. The transmitter according to claim 21 wherein the error detection code comprises an error detection and correction code.

28. The transmitter according to claim 27 wherein the error detection and correction code comprises a Bose-Chaudhuri-Hocquenghem error detection and correction code.

29. The method according to claim 21, wherein the predetermined number is not a part of the digital message to be transmitted.

30. A receiver for receiving digital radio communications over a radio channel wherein the digital radio communication includes a digital message and a transmission code and wherein the transmission code is generated by logically combining an error detection code with a predetermined number prior to transmission over the radio channel, the receiver comprising:

means for receiving the digital message and the transmission code over the radio channel;

means for logically combining the transmission code with the predetermined number thereby recovering the error detection code; and means for performing error detection on the received digital message using the recovered error detection code.

31. The receiver according to claim 30 wherein the means for logically combining the transmission code with the predetermined number comprises means for performing an exclusive-OR operation on the transmission code and the predetermined number.

32. The receiver according to claim 30 wherein the error detection code comprises a first plurality of bits, wherein the predetermined number comprises a second plurality of bits, and wherein the transmission code comprises a third plurality of bits, and wherein the first, second, and third pluralities of bits each comprise a common number of bits.

33. The receiver according to claim 32 wherein the predetermined number comprises a pseudo-random number.

34. The receiver according to claim 33 wherein the pseudo-random number comprises a binary pattern including 1010.

35. The receiver according to claim 34 wherein the binary pattern is chosen from the group consisting of 101010101100, 101011001010, and 110010101010.

36. The receiver according to claim 32:

wherein the digital message includes a priority status indicator indicating one of a high priority and a low priority for the digital message; and wherein the means for performing error detection further comprises means for disregarding the digital message when a high priority status is indicated and an error is detected.

37. The receiver according to claim 30 wherein the error detection code comprises an error detection and correction code.

38. The receiver according to claim 37 wherein the error detection and correction code comprises a Bose-Chaudhuri-Hocquenghem error detection and correction code.

39. The receiver according to claim 30:

wherein the digital message includes a priority status indicator indicating one of a high priority and a low priority for the digital message; and wherein the means for performing error detection further comprises means for disregarding a high priority status of the digital message when an error is detected so that the digital message is processed as a low priority digital message.

40. The receiver according to claim 30, wherein the predetermined number is not a part of the received digital message.

\* \* \* \* \*